United States Patent [19]

Agouridis et al.

[11] 4,243,885
[45] Jan. 6, 1981

[54] CADMIUM TELLURIDE PHOTOVOLTAIC RADIATION DETECTOR

[75] Inventors: Dimitrios C. Agouridis; Richard J. Fox, both of Oak Ridge, Tenn.

[73] Assignee: The United States of America as represented by the United States Department of Energy, Washington, D.C.

[21] Appl. No.: 78,759

[22] Filed: Sep. 25, 1979

[51] Int. Cl.³ .............................................. G01T 1/24
[52] U.S. Cl. .................................... 250/370; 357/30; 357/61; 357/63
[58] Field of Search .................... 250/370; 357/30, 61, 357/63

[56] References Cited

U.S. PATENT DOCUMENTS 3,582,654  6/1971  Meuleman ........................... 250/370

OTHER PUBLICATIONS

Siffert et al., "Polarization in Cadmium Telluride Nuclear Radiation Detectors", IEEE Trans. Nucl. Sci., vol. NS-23, No. 1, 2-76, p. 159-170.
Höschl et al., "Preparation of Cadmium Telluride Single Crystals for Nuclear Detectors", Czech J. Phys. B25, No. 5, 1975, pp. 585-596.
Desnica et al., "Cadmium Telluride Hole Lifetime from the Gamma-Ray and Photoinduced Effects", Chem. Abs. vol. 76, 1972, 78353f.
Scharf, "Exposure Rate Measurements of X- and Gamma-Rays with Silicon Radiation Detectors", Health Phys., vol. 13, 1967, pp. 575-586.

*Primary Examiner*—Alfred E. Smith
*Assistant Examiner*—Carolyn E. Field
*Attorney, Agent, or Firm*—James E. Denny; Stephen D. Hamel; David E. Breeden

[57] ABSTRACT

A dosimetry-type radiation detector is provided which employs a polycrystalline, chlorine-compensated cadmium telluride wafer fabricated to operate as a photovoltaic current generator used as the basic detecting element. A photovoltaic junction is formed in the wafer by painting one face of the cadmium telluride wafer with an n-type semiconductive material. The opposite face of the wafer is painted with an electrically conductive material to serve as a current collector. The detector is mounted in a hermetically sealed vacuum containment. The detector is operated in a photovoltaic mode (zero bias) while DC coupled to a symmetrical differential current amplifier having a very low input impedance. The amplifier converts the current signal generated by radiation impinging upon the barrier surface face of the wafer to a voltage which is supplied to a voltmeter calibrated to read quantitatively the level of radiation incident upon the detecting wafer.

4 Claims, 6 Drawing Figures

CADMIUM TELLURIDE PHOTOVOLTAIC RADIATION DETECTOR

BACKGROUND OF THE INVENTION

This invention relates generally to radiation detecting devices and more specifically to a photovoltaic-type radiation detecting device employing a cadmium telluride (CdTe) photovoltaic-detecting element for dosimetry-type radiation detection. It is a result of a contract with the U.S. Department of Energy.

Cadmium telluride spectrometer-type radiation detectors have been in use for several years. Problems due to carrier mobility requirements, trapping, polarization effects, and other causes make the construction of spectrometer grade detectors difficult. Considerable work has been devoted to the growth of CdTe as a material for room-temperature detection of gamma rays, for example. Although improvements have been made, especially using chlorine compensation (doping) for increasing the resistivity of the p-type material grown by the traveling heater method (THM), there are still drawbacks bound to the time stability of such detectors used as spectrometers wherein a bias voltage is applied. Once the bias voltage is applied, the peak position gradually shifts to lower energy, along with a decrease of the counting rate. This so-called "polarization effect" occurs as a function of time leading to a loss in detection efficiency which can be as high as 40% within a few hours. Various schemes have been devised in the art to stabilize CdTe detectors but are generally not totally operative and add considerable expense to the detecting systems.

Silicon diodes operating in the photovoltaic mode have been used as gamma- and X-ray radiation detectors for many years. The principal of operation of the detector resembles the principal of the photovoltaic solar cell: when the diode is irradiated with photons of sufficient energy to produce electron-hole pairs in the semiconductor, a photocurrent is produced in the external circuit without application of an external bias voltage. The photocurrent is composed of the electron-hole pairs which are produced in and near the diode junction and collected with the aid of the built-in field of the diode. Since radiation absorption depths for visible light and gamma radiation are different, some differences in the characteristics of the solar cells and gamma-ray detectors are expected. However, both the photovoltaic solar cell and a photovoltaic radiation detector may generally be analyzed in the same manner.

The problem with silicon diode detectors operated photovoltaically is that they are not sensitive to low-level radiation levels comparable to that detectable by a Geiger counter, for example, which has long been used in dosimeter-type detectors. The silicon diode junction impedance is relatively low which creates a high noise level that swamps signals produced by low-level radiation. CdTe crystals, as pointed out above, are now available with high resistivity ($10^8$ ohm cm), and have reasonable mobility and trapping time for electrons and holes which adds to its attraction for use as gamma-ray detectors that work at room temperature. The higher impedance junctions which may be formed improve the signal-to-noise ratio and thus the detection of low-level radiation. A semiconductor-type detector for dosimetry applications has considerable advantages over a proportional counter-type detector in savings in space, durability, and reliability of semiconductor materials and the associated simplicity in the detecting circuitry.

Therefore, it is a primary object of this invention to provide a CdTe photovoltaic gamma-ray dosimeter-type radiation detector.

Another object of this invention is to provide a dosimeter-type radiation detector as in the above object which has small size, light weight, and mechanical rigidity.

Further, it is an object of this invention to provide a low-level radiation detector as in the above objects which is operable at room temperature.

Other objects and many of the attendant advantages of the present invention will be obvious from the following detailed description taken in conjunction with the drawings.

SUMMARY OF THE INVENTION

A CdTe polycrystalline wafer having chlorine dopant is coated with a conductive material, such as colloidal graphite, on one side to form a p-n junction with the p-type crystal material, and on the opposite surface with an ohmic contact material, such as silver. The detecting crystal is placed in a radiation-pervious casing which is vacuum sealed with the crystal oriented to receive radiation to be detected at the p-n junction side thereof. The detecting diode so formed is operated in a photovoltaic mode while DC coupled to a symmetrical differential current amplifier having low input impedance. The output of the amplifier is connected to a voltmeter which is calibrated to read in radiation dose rates in selected multiples of Roentgens per hour (R/h).

DETAILED DESCRIPTION OF THE DRAWINGS

Figure 1:
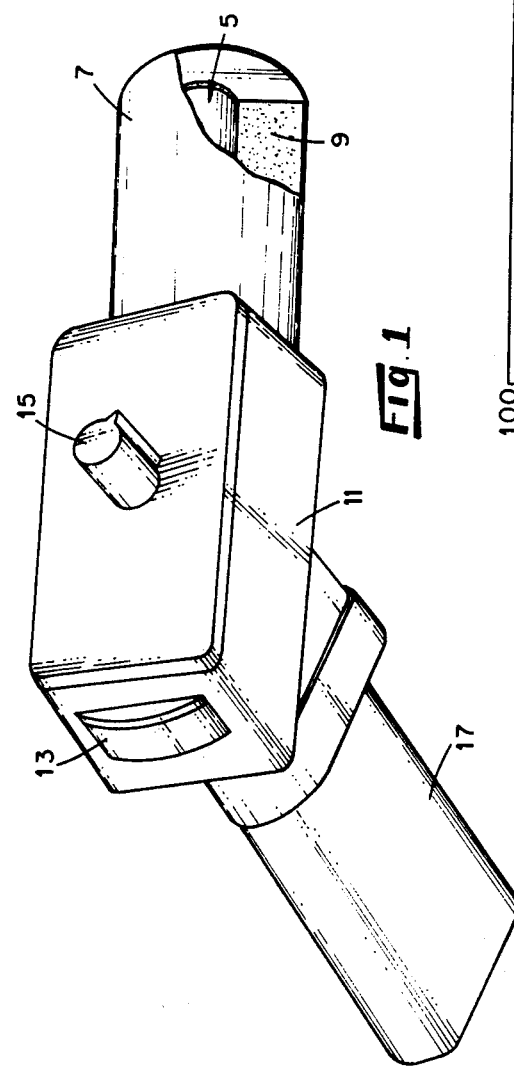
FIG. 1 is a perspective partially sectioned view of a hand-held radiation detector made in accordance with the present invention.

Referring now to FIG. 1, there is shown a perspective view of a packaged radiation detector embodying the detecting system according to the present invention. An encapsulated diode detecting element 5 is enclosed within an aluminum protective cup housing 7 with a thermal insulating material 9, such as Styrofoam, surrounding the detecting element 5. The housing element 7 is mounted on the front portion of the detector electronic housing member 11 with the detector element electrically coupled to the circuit through a connector in the front of the housing 11 (not shown). The back wall of the housing 11 is provided with a meter 13 for viewing the radiation level detected. Mounted atop the housing 11 is a scale-selector switch 15. A handle portion 17 is provided which depends from the bottom side of the housing 11 and houses the battery power pack for the detecting unit. Although a hand-held instrument is illustrated in FIG. 1 for purposes of illustrating one way in which the invention may be used, it will be understood that the detecting system may be embodied in various other detecting arrangements.

Figure 2:
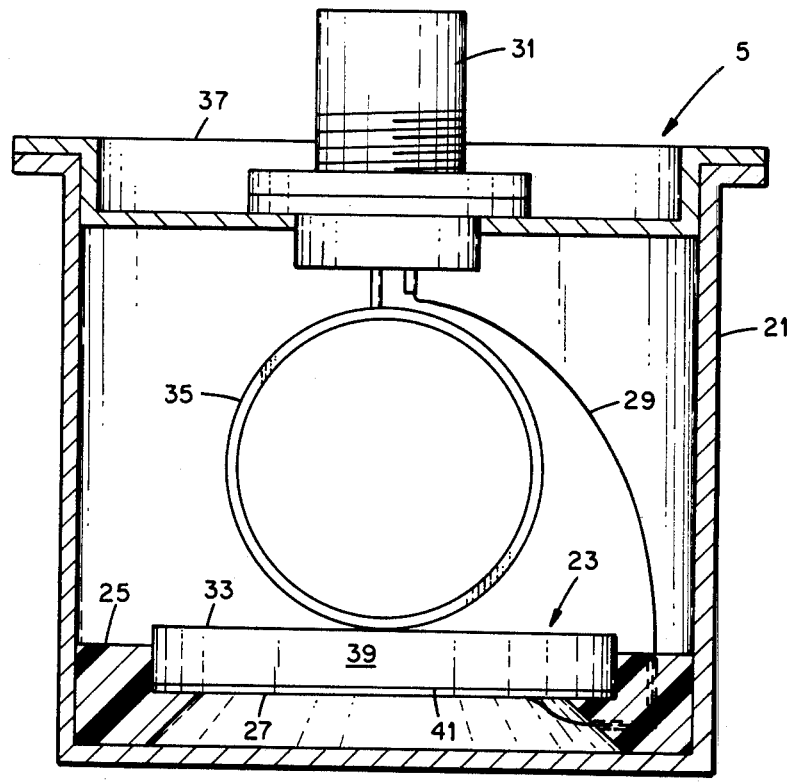
FIG. 2 is a cross-sectional view of a CdTe photovoltaic-detecting element housing which is the detecting element for the instrument shown in FIG. 1.

Referring now to FIG. 2, the detector element canister 5 is shown in cross section. The canister includes a cup portion 7 constructed of aluminum or other radiation permeable material. The CdTe-detecting wafer 23, whose structure will be described hereinbelow, is mounted in the front end of the detector by means of a Teflon insulating ring 25. A conductive aluminum plate 27 is provided which provides electrical contact to the front, or radiation-receiving surface, of the detecting diode 23. Electrical connection is made to the plate 27 by means of an electrical lead 29 which extends through an opening in the insulator 25 and is soft soldered to the zinc-coated outer side of the plate 27. The purpose of the zinc coating on the outer side of plate 27 is to permit soldering. The other end of lead 29 is connected to one terminal of a hermetic electrical connector 31. The back, or ohmic contact surface of the detector diode 23, is contacted by a beryllium-copper spring ring 35 faced with indium. The ring is approximately 0.333-inch diameter by 0.125-inch in width, of 0.010-inch Be-Cu. The purpose of the ring 35 is to provide electrical connection between the back side (ohmic collector) of the diode 23 and the second terminal of the connector 31 while acting as a spring to urge the diode wafer 23 into its assembly position within the insulator 25.

Once the detector assembly connections are made the canister 21 is evacuated and baked out at 70° C. for 2 hours and a cap portion 37 through which the connector 31 extends is placed over the canister and cold pressure welded to form a hermetically sealed vacuum canister for the detector diode 23.

Referring now specifically to the diode 23 structure, the diode is made by cutting a 2-mm thick cylindrical wafer 39 from a commercially available CdTe ingot. The wafer diameter may range from 1 to 1.6 cm. The ingots must be of high resistivity (greater than $10^8$ ohm cm) p-type, grown by the traveling heater method, and doped with chlorine. The photovoltaic junctions are made by lightly lapping both faces of the wafer. The front, or radiation receiving face 41, is coated with a thin film of Aquadag (colloidal graphite in an aqueous base) to form the required "n" on "p" photovoltaic junction. The opposite face 33 is painted with silver paint (silver flake in an organic base) to serve as a current collector. Ideally, this contact should be ohmic and insensitive to radiation; otherwise, some signal cancellation may result. In the detector shown it was found that the response of the silver contact to low-energy gamma rays is only 15% of the signal produced by the graphite contact. Therefore, the silver-to-CdTe contact is effectively ohmic.

Operation of the detector in a photovoltaic mode rather than in a pulse mode (reverse bias voltage applied) avoids completely the polarization effect associated with chlorine-compensated CdTe. Under this zero-bias condition, no loss in gamma-ray response with time is observed in the detector. However, even a brief inadvertent application of a bias voltage to the detector causes some short-term (hours) drift in gamma-ray response. Therefore, it will be appreciated that the diode must be operated in a circuit which does not apply a bias voltage to the diode 23.

The photovoltaic junctions described above generated a significant electrochemical EMF (m volts) in a humid ambient. Therefore, the devices should be vacuum baked at approximately 70° C. prior to hermetically encapsulating.

Figure 3:
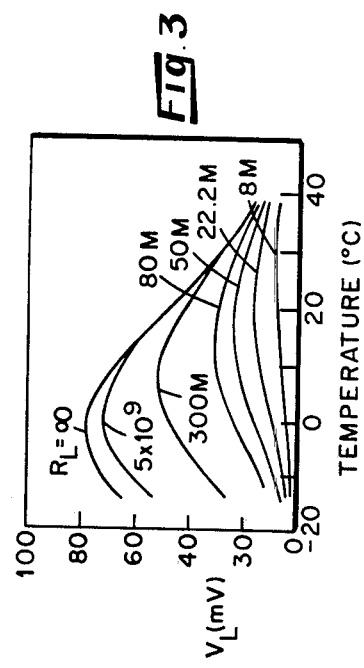
FIG. 3 is a graph illustrating the change in output voltage as a function of temperature for a CdTe detector under constant gamma-ray flux and variable load.

The gamma-ray response versus temperature for a typical detecting wafer with various resistance loads $R_L$ is shown in FIG. 3. This test was made using a detector constructed as described above placed in a constant gamma-ray flux of 5 R/hr, $^{241}$Am. The temperature was varied from $-20°$ to $+60°$ C. while measuring the voltage $V_L$ in millivolts across the load resistor. Clearly, the temperature dependence of the device is minimized as the short-circuit condition is approached. Rather than using a resistive loading with its attendant loss of signal, a low-input impedance, current-sensitive amplifier has been designed to allow the detector to be operated in the current mode. This reduces the temperature dependence of the detector gamma-ray response to less than 0.25% per °C.

Figure 4:
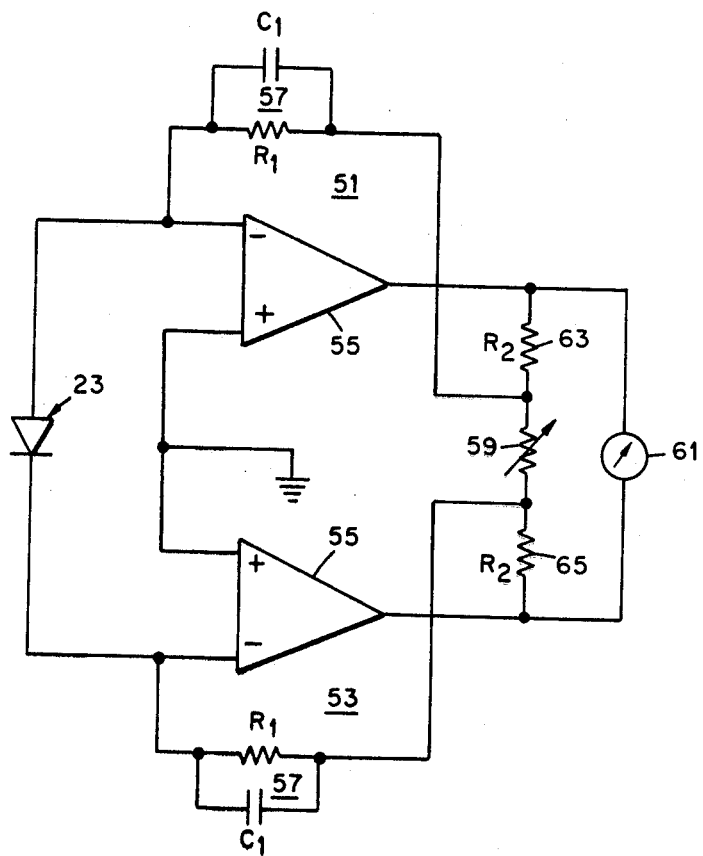
FIG. 4 is a schematic circuit diagram of the radiation detector made in accordance with the present invention.

The current amplifier, or current-to-voltage converter, designed to match the characteristics of the detector is shown in FIG. 4. As shown, the amplifier is a differential amplifier which is suitable for amplification of signals from current-source transducers. In this application the amplifier proved superior to a regular (single) current-to-voltage converter, giving better temperature stability and better common-mode rejection. The amplifier consists of two single current-to-voltage converters 51 and 53 in a mirror-image connection. Each of the converters 51 and 53 consists of an operational amplifier 55 having their non-inverting inputs connected to ground potential, and a feedback network 57 consisting of parallel-connected matched resistors R1 and capacitors C1. The feedback networks are connected between the inverting inputs of the respective amplifiers and the respective ends of a variable load resistor 59. The output of converter 51 is connected to one terminal of a voltmeter 61 and through a resistor 63 to the feedback connection at one end of the variable resistor 59. The converter 53 output is connected to the other terminal of the voltmeter 61 and through resistor 65 to the common connection of the feedback loop and the opposite end of the variable resistor 59. The detector 23 is connected between the inverting inputs of the amplifiers 55 of the converters 51 and 53, respectively. The amplifiers are commercially available operational amplifiers, such as the model AD515 supplied by Analog Devices Corp. (Route One Industrial Park, P. O. Box 280, Norwood, Massachusetts 02062).

The time constant of the amplifier is fixed by selecting the appropriate value for the capacitors C1 in parallel with resistors R1. Thus the time constant is $\frac{1}{2}R_1C_1Hz$, typically 1–2 seconds. The gain of the amplifier is controlled by varying the resistor 59 which corresponds to the variable scale selector control 15 shown in FIG. 1.

The symmetrical configuration of the amplifier reduces drift signals caused by temperature changes and other environmental conditions. All the amplifier circuit components are preferably symmetrically mounted on a thick ($\frac{1}{8}$ inch) aluminum base plate to minimize circuit thermal gradients and to cancel thermoelectric potentials as much as possible. The base plate may be contained within a thick-walled ($\frac{1}{4}$ inch), cast aluminum box 11 as shown in FIG. 1 to further reduce internal thermal gradients.

The decrease of the detector output signal at low temperatures (FIG. 3) and at constant radiation flux is apparently due to conductivity modulation of the diode leakage resistance with radiation because a substantial percentage of the free carriers in the CdTe material is generated in the electron-hole pair production from the absorbed radiation.

Consideration must be given to thermoelectric effects, for if such an EMF were to originate in the detector, the response would be indistinguishable from a response to radiation. Therefore, the detector is placed in a jacket of thermal insulation such as Styrofoam (cover 9 shown in FIG. 1) which has a thermal relaxation time much longer than that of the CdTe crystal. Thus, the thermal gradient within the crystal remains essentially zero, and negligible thermal electric EMF is generated by the crystal. Additionally, both zero drift and gain drift of the amplifier must be as temperature independent as possible. The zero drift is reduced effectively by using the differential amplifier arrangement with appropriate circuit symmetry.

Figure 5:
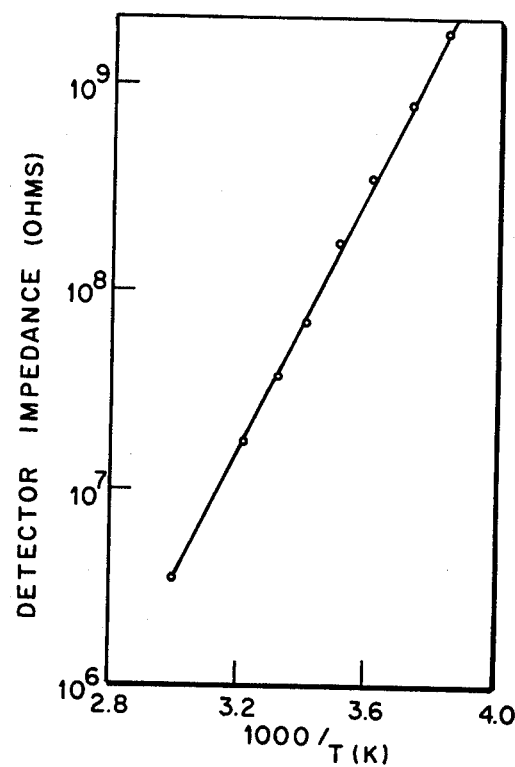
FIG. 5 is a graph of output impedance vs reciprocal temperature of a CdTe detector.

Since the detector impedance is a strong function of temperature, as shown in FIG. 5, the amplifier gain should be independent of the source impedance. This is accomplished with the amplifier circuit shown in FIG. 4. The gain is established by the selection of the series feedback resistance ($R_1$ and $R_2$).

The maximum usable sensitivity of the system depends on the detector, the amplifier, and the environmental condition. Tests with a 2-mm thick, 2-cm² area detecting diode constructed as described above and shown in FIG. 2 and the differential amplifier circuit as shown in FIG. 4 with a 1.7-second integration time, radiation fluxes of 0.1 mR/h from $^{241}$Am and 5 mR/h from $^{60}$Co were detected when the radiation was chopped (source on-off). Under field operating conditions, the usable radiation sensitivity dropped to about 0.5 mR/h from $^{241}$Am and 20 mR/h from $^{60}$Co.

Figure 6:
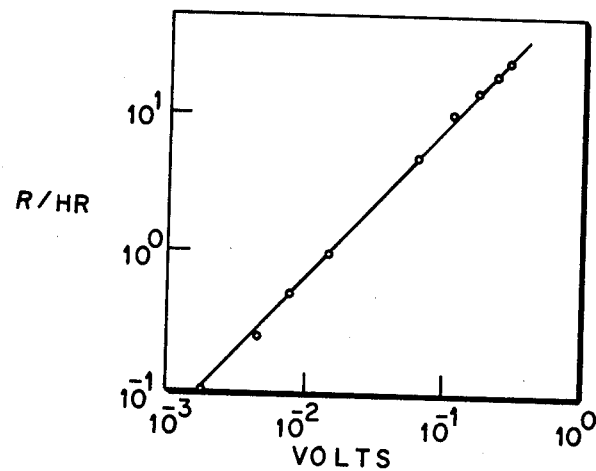
FIG. 6 is a graph of output current of a CdTe detector as a function of gamma-ray flux from $^{226}$Ra.

The linearity of radiation response (current mode) was measured with $^{226}$Ra up to 25 R/h, and there was no indication of saturation as can be seen from the graph, FIG. 6, which shows the output voltage versus gamma-ray flux from a $^{226}$Ra.

The temperature sensitivity of this system was investigated by thermally cycling from 0°–55° C. and in the absence of radiation. The electrical zero at the output shifted 0.2 mR/h equivalent radiation from a $^{241}$Am source. The temperature dependence of the radiation response was less than 0.25% per °C.

Thus it will be seen that a photovoltaic CdTe dosimetry-type detector is provided which is responsive to low-level gamma- as well as X-ray radiation, rugged and mechanically reliable due to the solid-state components. Further, it is adaptable to miniaturization for use in various embodiments. For example, the detecting system may be made quite small for use as a personnel monitor in industrial and military applications where it is desirable to determine gamma- or X-ray radiation doses without the necessity of spectroscopic analysis. The chlorine-compensated CdTe polycrystal used in such a detector is readily available and relatively inexpensive, and does not polarize when operated photovoltaically.

Although the invention has been illustrated by way of a specific embodiment, it will be appreciated that various modifications and changes may be made in the described embodiment without departing from the spirit and scope of the invention as set forth in the following claims attached to and forming a part of this specification.

What is claimed is:

1. A radiation dosimeter for detecting low-level ionizing radiation comprising:
    a photovoltaic semiconductor diode-detecting element including a thin wafer of chlorine-doped cadmium telluride p-type semiconductor material having a front radiation-receiving surface and a rear surface, a film of n-type material coating said front surface of said wafer forming a p-n photovoltaic junction and an electrically conductive film coating said rear surface forming a current collector;
    a current-to-voltage converter means for converting a photocurrent generated by said detecting element when placed in an ionizing radiation flux to a voltage at the output thereof proportional to the radiation dose rate; and
    means for measuring said output voltage of said connecter means.

2. The radiation dosimeter as set forth in claim 1 wherein said current-to-voltage converter means includes first and second current amplifiers connected in a mirror image connection arrangement to form a differential amplifier having first and second inputs between which said detecting diode is connected.

3. The radiation dosimeter as set forth in claim 2 wherein said front surface film is colloidal graphite and said rear surface film is silver.

4. The radiation dosimeter as set forth in claim 3 wherein said detecting element further includes a hermetically sealed vacuum containment housing constructed of a radiation permeable material for containing said detecting element in a vacuum environment; an electrically conductive contact plate formed of radiation permeable material insulatably disposed within said housing parallel and adjacent to a front radiation receiving surface of said housing and contacting said front surface film of said detecting wafer for providing electrical connection to said front surface film of said wafer and electrical connection means for connecting said contact plate and said current collector surface of said detecting diode to the respective inputs of said first and second current amplifiers.

* * * * *